(12) United States Patent
Ankireddi

(10) Patent No.: US 7,449,775 B1
(45) Date of Patent: Nov. 11, 2008

(54) INTEGRATED THERMAL SOLUTION FOR ELECTRONIC PACKAGES WITH MATERIALS HAVING MISMATCHED COEFFICIENT OF THERMAL EXPANSION

(75) Inventor: Seshasayee S. Ankireddi, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 203 days.

(21) Appl. No.: 11/439,039

(22) Filed: May 22, 2006

(51) Int. Cl.
*H01L 23/34* (2006.01)

(52) U.S. Cl. .............. 257/712; 257/717; 257/E23.08; 257/E23.101

(58) Field of Classification Search .................. 257/712
See application file for complete search history.

(56) References Cited

U.S. PATENT DOCUMENTS

| | | | |
|---|---|---|---|
| 4,226,281 A | 10/1980 | Chu | |
| 4,381,032 A | 4/1983 | Cutchaw | |
| 4,483,389 A | 11/1984 | Balderes et al. | |
| 4,715,430 A | 12/1987 | Arnold et al. | |
| 5,046,552 A | 9/1991 | Tousignant | |
| 5,528,337 A | 6/1996 | Kawano | |
| 5,714,738 A | 2/1998 | Hauschulz et al. | |
| 5,920,457 A | 7/1999 | Lamb et al. | |
| 6,650,538 B1 | 11/2003 | Chu et al. | |
| 6,690,578 B2 | 2/2004 | Edelmann | |
| 6,867,976 B2 | 3/2005 | Belady et al. | |
| 7,206,203 B2 | 4/2007 | Campbell et al. | |
| 2003/0150605 A1 | 8/2003 | Belady et al. | |

*Primary Examiner*—David A Zarneke
(74) *Attorney, Agent, or Firm*—Martine Penilla & Gencarella, LLP

(57) ABSTRACT

A decoupling package stack including a circuit board, a substrate mounted on and electrically coupled to the circuit board, a semiconductor die mounted on and electrically coupled to the substrate a deformable elastomeric support mounted on the substrate, one or more mounts coupled to the circuit board and a heatsink. The heatsink includes a contoured heatsink base having a spacer attached thereto, the spacer operable to determine and maintain a desired bondline of a first thermal interface material (TIM) between the semiconductor die and the contoured heatsink base. The heatsink also includes one or more contact portions for contacting the deformable elastomeric support and one or more compressing surfaces coupled to the one or more mounts. A method for assembling a decoupling package stack.

13 Claims, 8 Drawing Sheets

INTEGRATED THERMAL SOLUTION FOR ELECTRONIC PACKAGES WITH MATERIALS HAVING MISMATCHED COEFFICIENT OF THERMAL EXPANSION

BACKGROUND

The present invention relates generally to packaging semiconductor devices and more specifically systems and methods for packaging semiconductor devices using materials having significantly mismatched coefficients of thermal expansion (CTEs).

The power dissipated by electronic semiconductor packages such as ASICs/microprocessors continues to grow with the demand for higher performance. This growth in power dissipation requirements has grown at an unabated rate in recent years. Thermal engineers often consider the use of newer, high conductivity materials in the semiconductor package stack to enable effective transfer of the heat generated in the semiconductor devices.

FIG. 1 is a simplified diagram of a typical semiconductor package stack 100. The package stack 100 includes a cavity-based lid 102, a semiconductor device die 104, a die-lid thermal interface material (TIM1) 110, and a substrate 120. A heatsink 130 and a lid-heatsink thermal interface material (TIM2) 132 are also shown.

The ability to transfer heat away from the die 104 assumes that the package stack 100 can be assembled in the first place. The different materials used in the high conductivity lid 102, TIM1 110 and substrate 120 can often be incompatible with each other from a thermal expansion perspective (as quantified using the Coefficient of Thermal Expansion, or CTE). As a result, assembly of the package stack 100 can be a significantly difficult task with part failures occurring during lid attach, cure and standard temperature cycle testing.

FIG. 2 is a simplified diagram of an incompatible package stack 200. As the temperatures in the stack 200 increase or decrease, the different CTE can cause the lid 102 to deform. Spaces 202 and 204 can be formed as the lid 102 deforms. Spaces 202 between the edge of the lid 102 and the substrate 120 are referred to as edge delamination. Space 204 between the die 104 and the central portion of the lid 102 is referred to die-level delamination. Typically the edge delamination and the die-level delamination occur after TIM1 110 is cured and/or during temperature cycling. The spaces 202 and 204 prevent the heat from being effectively transferred from the die 104 to the lid 102 and from the lid to the substrate 120.

While being an excellent idea in principle, the actual use of high conductivity materials in the lid 102 and the TIM1 110 in the package stack becomes substantially difficult, if not impossible to implement in practical applications when the materials have significant CTE mismatches. In view of the foregoing, there is a need for a system and method of overcoming the physical issues associated with the mismatched CTEs.

SUMMARY

Broadly speaking, the present invention fills these needs by providing systems and methods for packaging semiconductor devices using materials having significantly mismatched coefficients of thermal expansion (CTEs). It should be appreciated that the present invention can be implemented in numerous ways, including as a process, an apparatus, a system, computer readable media, or a device. Several inventive embodiments of the present invention are described below.

One embodiment provides a decoupling package stack including a circuit board, a substrate mounted on and electrically coupled to the circuit board, a semiconductor die mounted on and electrically coupled to the substrate, a deformable elastomeric support mounted on the substrate, one or more mounts coupled to the circuit board and a heatsink. The heatsink includes a contoured heatsink base having a spacer attached thereto, the spacer operable to determine and maintain a desired bondline of a first thermal interface material (TIM) between the semiconductor die and the contoured heatsink base. The heatsink also includes one or more contact portions for contacting the deformable elastomeric support and one or more compressing surfaces coupled to the one or more mounts.

The contoured heatsink base provides for load staging. The deformable elastomeric support can share a thermal load with the first TIM between the package and the contoured heatsink base. Depending on the shape and/or contour of the elastomeric support, the elastomeric support can also provide a heat transfer path from the substrate to the heatsink. The deformable elastomeric support can share a physical load with the semiconductor die.

A first portion of a physical load from the contoured heatsink base can be applied to the deformable elastomeric support before a second portion of the physical load is applied to the semiconductor die. The deformable elastomeric support is at least partially deformed before the second portion of the physical load is applied to the semiconductor die. The elastomeric support can wrap around an edge of the substrate.

The decoupling package stack can also include a lid interposed between the semiconductor die and the contoured heatsink base. The lid can be thermally coupled by a second TIM interposed between the lid and the semiconductor die. The lid can distribute heat radiating from the semiconductor die to the contoured heatsink base.

The contoured heatsink base can include a secondary material. The contoured heatsink base can include an enclosed cavity capable of containing a cooling media, an inlet coupled to the cavity and capable of flowing the cooling media into the enclosed cavity and an outlet coupled to the cavity and capable of flowing the cooling media out of the enclosed cavity.

Another embodiment provides a decoupling package stack including a circuit board, a substrate mounted on and electrically coupled to the circuit board, a semiconductor die mounted on and electrically coupled to the substrate, a deformable elastomeric support mounted on the substrate, one or more mounts coupled to the circuit board and a heatsink. The heatsink including a contoured heatsink base having a spacer attached thereto. The spacer operable to determine and maintain a desired bondline of a first thermal interface material (TIM) between the semiconductor die and the contoured heatsink base. The heatsink can also include one or more contact portions for contacting the deformable elastomeric support and one or more compressing surfaces coupled to the one or more mounts. A first portion of a physical load from the contoured heatsink base is applied to the deformable elastomeric support before a second portion of the physical load is applied to the semiconductor die. The deformable elastomeric support is at least partially deformed before the second portion of the physical load is applied to the semiconductor die and wherein the deformable elastomeric support shares a thermal load with the first TIM between the package and the contoured heatsink base.

Yet another embodiment provides a method of assembling a decoupling package stack including assembling a semiconductor die onto a substrate, installing elastomeric support on the substrate, mounting the semiconductor die and substrate assembly on a circuit board. A desired quantity of a first thermal interface material (TIM) is dispensed on the semiconductor die. A heatsink is placed in the desired position; and a compressive force is applied until a contoured base of the heatsink contacts the first TIM. Additional compressive force is applied until a spacer mounted on the contoured heatsink base contacts the substrate and forms desired bondline of the first TIM.

Assembling the semiconductor die onto the substrate can include testing the semiconductor die and substrate assembly. Applying the compressive force until the contoured heatsink base contacts the first TIM includes applying a first portion of a physical load from the contoured heatsink base to the deformable elastomeric support and wherein applying additional compressive force until the spacer mounted on the contoured heatsink base contacts the substrate and forms desired bondline of the first TIM includes applying a second portion of the physical load to the semiconductor die.

The deformable elastomeric support is at least partially deformed before the second portion of the physical load is applied to the semiconductor die. The method can also include installing a lid interposed between the semiconductor die and the contoured heatsink base. The lid can be thermally coupled by a second TIM interposed between the lid and the semiconductor die.

The contoured heatsink base can include an enclosed cavity capable of containing a cooling media and an inlet and an outlet. The inlet is coupled to the cavity and capable of flowing the cooling media into the enclosed cavity. The outlet is coupled to the cavity and capable of flowing the cooling media out of the enclosed cavity. The method can also include flowing the cooling media through the contoured heatsink base.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for systems and methods for packaging semiconductor devices using materials having significantly mismatched coefficients of thermal expansion (CTEs) will now be described. It will be apparent to those skilled in the art that the present invention may be practiced without some or all of the specific details set forth herein.

One embodiment provides a system and method for decoupling the materials having significantly mismatched CTEs involved in a manner that can be readily manufactured. Decoupling the materials having significantly mismatched CTEs substantially eliminates the occurrence of edge and die-level delamination.

Figure 1:
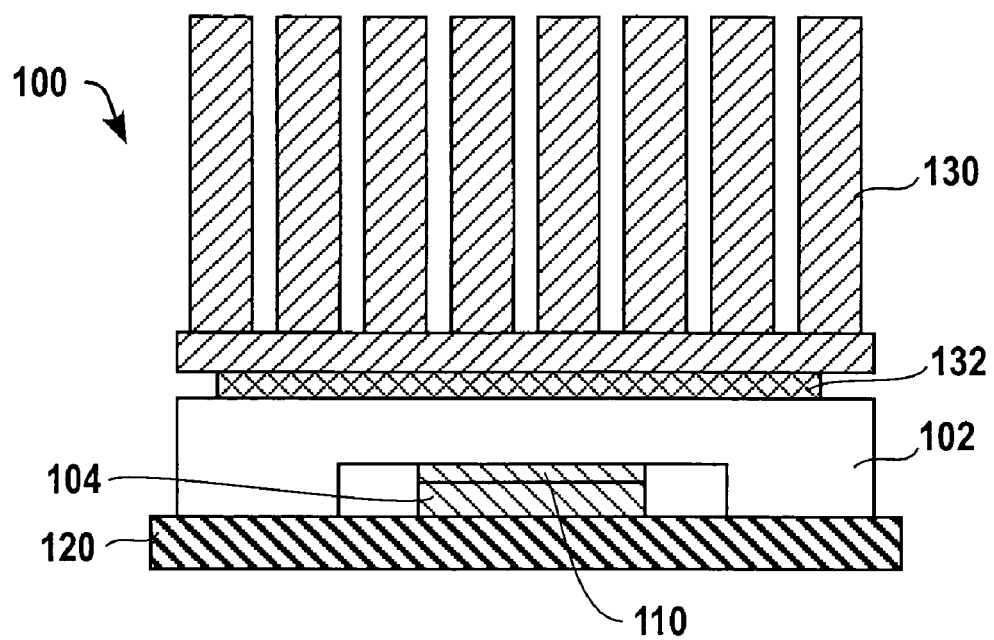
FIG. 1 is a simplified diagram of a typical semiconductor package stack.
Figure 2:
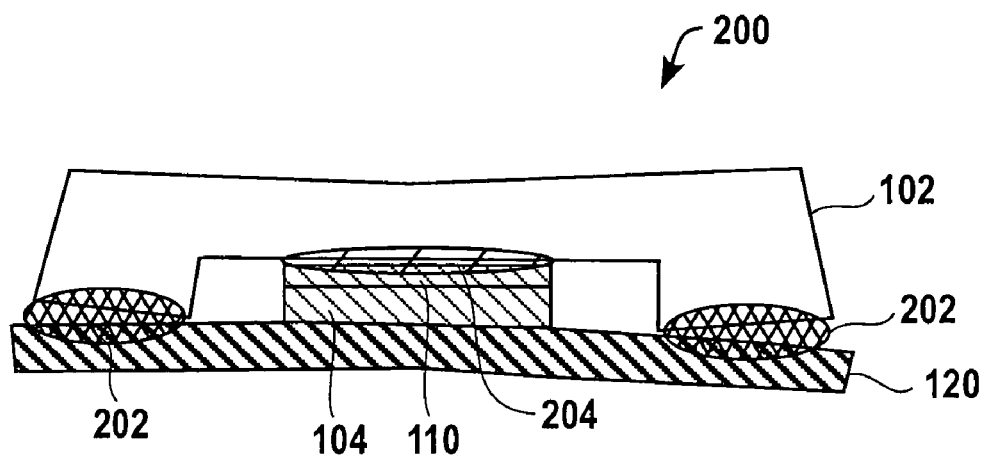
FIG. 2 is a simplified diagram of an incompatible package stack.
Figure 3:
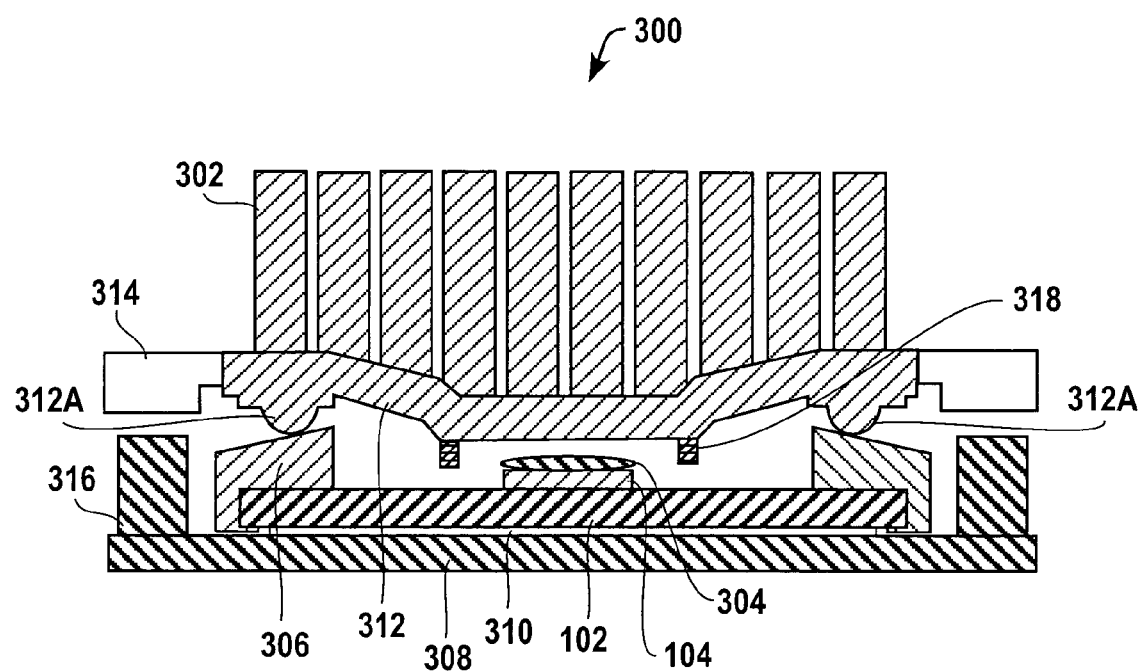
FIG. 3 is a side view of a decoupling package stack, in accordance with an embodiment of the present invention.

FIG. 3 is a side view of a decoupling package stack 300, in accordance with an embodiment of the present invention. The decoupling package stack 300 substantially eliminates the occurrence of edge and die-level delamination. The decoupling package stack 300 includes a substrate 102, a die 104, a heatsink 302, a lid-heatsink base thermal interface material (TIM0) 304 and a deformable elastomeric support ring 306. The deformable elastomeric support ring 306 has a specific shape, designed for load transfer and load bearing. The elastomeric support can include one or more natural, polyacrilic or polysulfide rubbers or a polyisoprene, polybutadiene or any of several silicone containing materials and any other suitable materials and any combinations thereof. It should be understood that these are merely exemplary materials for the elastomeric support and that any suitable materials or combinations thereof can be used. The substrate 102 is mounted on a circuit board 308. An electrical interconnect 310 electrically couples the substrate 102 to the circuit board 308.

The heatsink 302 includes a contoured base 312. The contoured base 304 can be made from a high conductive material or other suitable lid materials. By way of example, the contoured base 304 can be copper, aluminum, tungsten or alloys or combinations thereof or other similar suitable materials including plated materials such as copper or aluminum plated steel. The contact portions 312A of the contoured base 312 contact the deformable elastomeric support ring 306. The heatsink 302 also includes compressing surfaces 314 for mechanically coupling the heatsink to the mounts 316 on the circuit board 308. The compressing surfaces 314 can be secured to the mounts 316 by any suitable methods as are well known in the art (e.g., screws, rivets, latches, etc.) A spacer 318 is attached to the heatsink base 312. The spacer 318 determines a bondline thickness of the TIM0 314. The spacer 318 can enclose all of or one or more portions of a circumference around the die 104.

As shown in FIG. 3, the semiconductor die 104 is manufactured without a lid on the die. However, when the semiconductor die 104 is installed in the complete package stack 300, the contoured base 312 serves effectively as a lid.

Figure 4A:
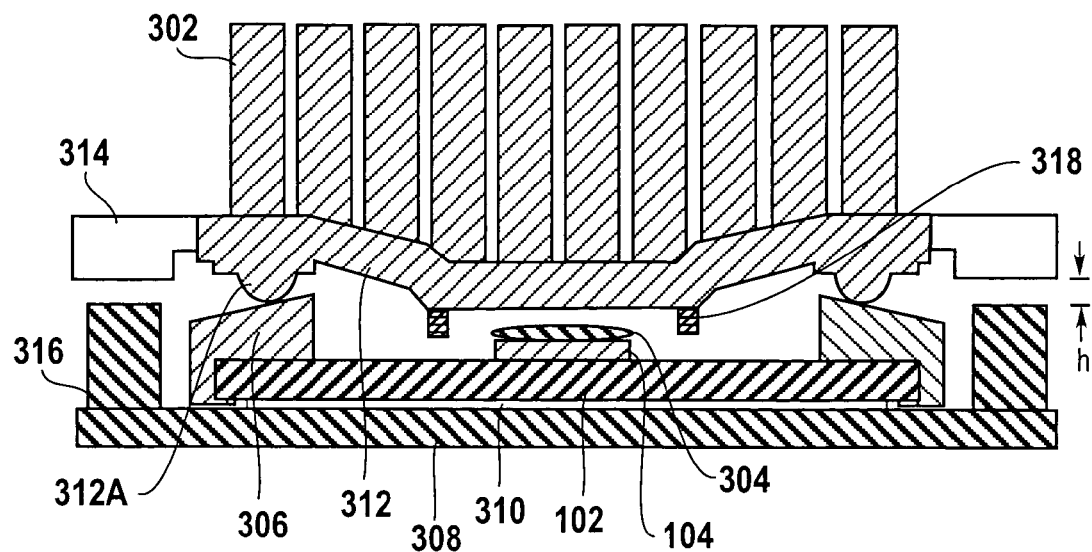
FIGS. 4A-C illustrate the assembly of the package stack, in accordance with an embodiment of the present invention.
Figure 4B:
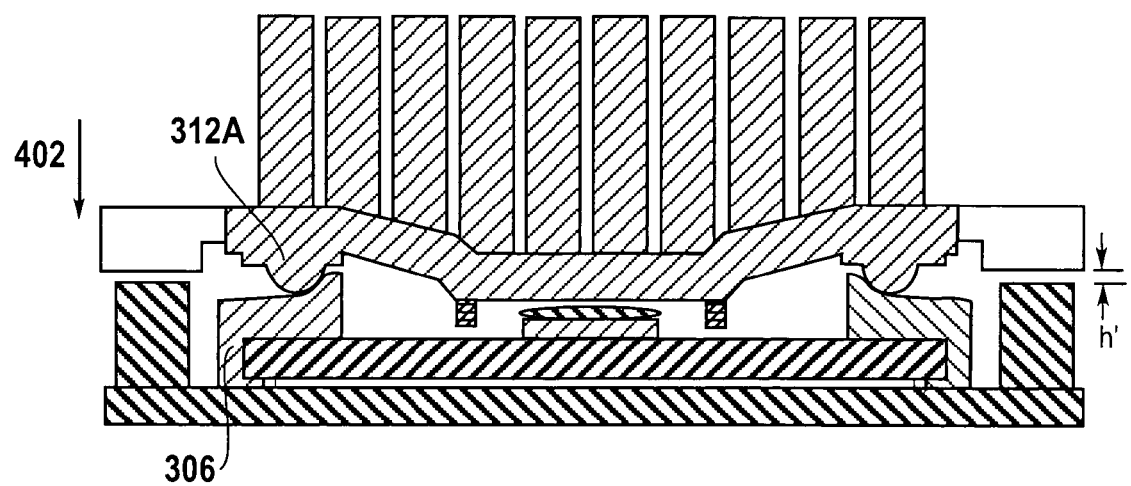
Figure 4C:
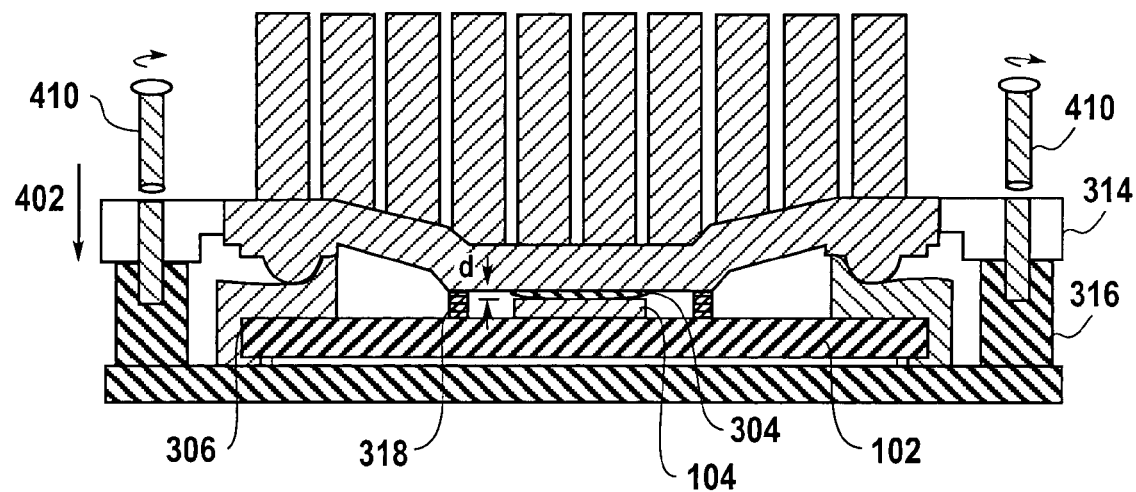
Figure 4D:
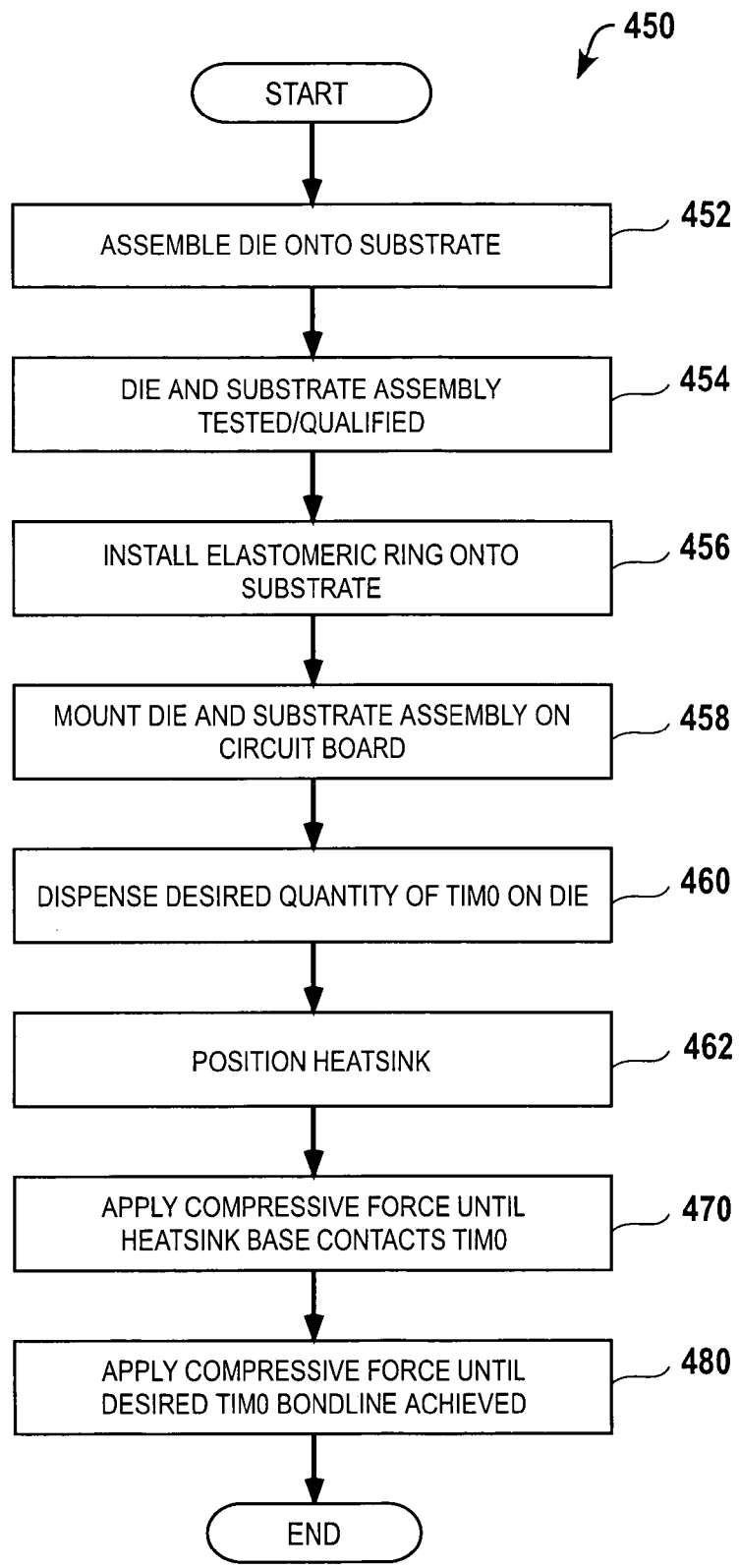
FIG. 4D is a flowchart of the method operations for assembling the package stack, in accordance with an embodiment of the present invention.

FIGS. 4A-C illustrate the assembly of the package stack 300, in accordance with an embodiment of the present invention. FIG. 4D is a flowchart of the method operations 450 for assembling the package stack 300, in accordance with an embodiment of the present invention. Referring first to FIGS. 4A and 4D, in an operation 452, the lidless die 104 is assembled onto the substrate 102. In an operation 454, the lidless die 104 and substrate 102 assembly is tested and/or qualified.

In an operation 456, the elastomeric support ring 306 is installed on the substrate 102. The lidless die 104 and substrate 102 assembly is mounted onto the circuit board 308 in an operation 458. A desired quantity of TIM0 304 is dispensed on the exposed surface of the die 104 in an operation

460. The heatsink 302 is placed in the correct position in an operation 462. The heatsink 302 can be positioned by any suitable method (e.g., manually or automatically, or using a pick/place tool). In the correct position, the portions 312A of the contoured base 312 initially contact the elastomeric support ring 306 and a distance h is between the heatsink mount points 314 and the mounts 316 on the circuit board 308.

Referring now to FIGS. 4B and 4D, in an operation 470, a clamping or compressive force 402 is applied to the heatsink mount points 314, pushing the base 312 toward the circuit board 308. The compressive force 402 is applied to the heatsink mount points 314 until the contoured base 312 of the heatsink initially contacts the dispensed TIM0 304 and a distance h' is between the heatsink mount points 314 and the mounts 316 on the circuit board 308. As the compressive force 402 is applied to the heatsink mount points 314, the contoured base 312 begins to compress and deform the elastomeric support ring 306. The elastomeric support ring 306 supports the applied load and the applied load is transmitted to the die 104.

Referring now to FIGS. 4C and 4D, in an operation 480, the compressive force 402 is further applied to the heatsink mount points 314 until the spacer 318 contacts the substrate 102. The TIM0 304 is thereby compressed between the contoured base 312 and the die 104 to a desired thickness d (referred to as a TIM0 bondline). In an optional operation 482, one or more mechanical fasteners 410 can be installed to secure the heatsink mount points 314 to the mounts 316 on the circuit board 308.

The physical compressive load applied by the contoured base 312 of the heatsink 302 is shared between the die 104 and the elastomeric support ring 306. Similarly, the thermal load can also be shared between the die 104 and the elastomeric support ring 306, depending upon the shape and/or contour of the elastomeric support. Because the load applied by the contoured base 312 of the heatsink 302 is shared between the die 104 and the elastomeric support ring 306, the TIM0 bondline has a substantially constant thickness d independent of the temperature of the package stack 300. The substantially constant thickness of TIM0 bondline ensures a substantially constant thermal conduction from the die 104 to the contoured base 312 of the heatsink 302 throughout the operating temperature range and operational lifetime of the package stack 300. As a result the operational lifetime of the package stack 300 is increased over a prior art package stack (e.g., package stack 200) subject to edge delamination and/or die-level delamination.

Figure 5:
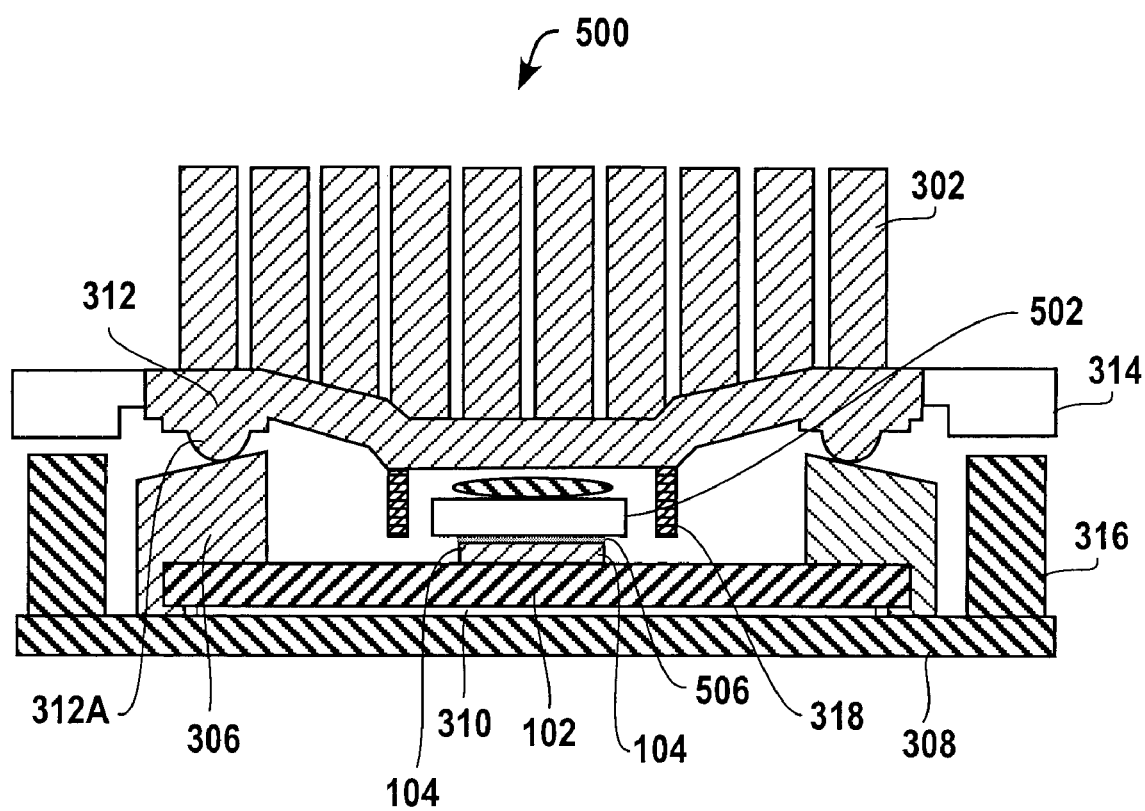
FIG. 5 is a side view of a decoupling package stack, in accordance with an embodiment of the present invention.

FIG. 5 is a side view of a decoupling package stack 500, in accordance with an embodiment of the present invention. The decoupling package stack 500 is substantially similar to the decoupling package stack 300 described in more detail above in FIGS. 3-4D. The decoupling package stack 500 also includes a lid 502. The lid 502 can be substantially flat and have a physical size approximately the same size or slightly larger or smaller than the die 104. The lid 502 distributes the heat radiating from the semiconductor die 104 and increases the area thermally coupled to the contoured sink base 312.

The lid 502 can be adhesively and/or thermally bonded to the die 104. By way of example a quantity of a TIM1 506 can be placed between the lid 502 and the die 104. The lid 502 can be manufactured from any suitable heat transferring material. By way of example, the lid 502 can be manufactured from any suitable material. During the assembly of the package stack 500 a TIM2 504 can be compressed to a desired bondline between the lid 502 and the contoured base 312. The TIM1 506 and TIM2 504 can be the same or different than the TIM0 304 described above in FIGS. 3-4D.

The spacer 318 provides accurate bondline thickness control for "lidless" design packages (e.g., FIGS. 3-4D) and for "lidded" design packages (e.g., FIG. 5).

The heatsink 302 can employ any one or more of several cooling mechanisms. By way of example, the heatsink 302 can dissipate heat to ambient air. The air can be purposely circulated over and across the heatsink 302 to aid in dissipating the heat from the heatsink to the air.

Figure 6A:
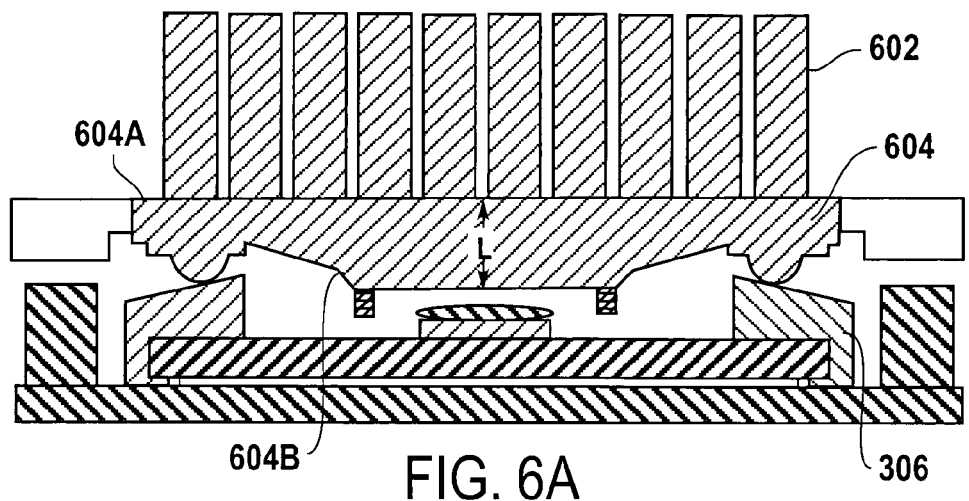
FIG. 6A is a side view of an alternative heatsink, in accordance with an embodiment of the present invention.

FIG. 6A is a side view of an alternative heatsink 602, in accordance with an embodiment of the present invention. The heatsink 602 includes a contoured base 604 that is somewhat thicker and a simpler design than the contoured base 312 described above. The contoured base 604 is substantially flat on a first surface 604A and contoured on the second surface 604B. The contoured second surface 604B interfaces to the die 104 and elastomeric support ring 306 as described above. The substantially flat first surface 604A simplifies the manufacture of the contoured base 604 as only the contoured second side 604B is contoured. The contoured base 604 can therefore be substantially thicker L than the contoured base 312 described above. The thicker contoured base 604 can provide additional thermal mass than the contoured base 312.

Figure 6B:
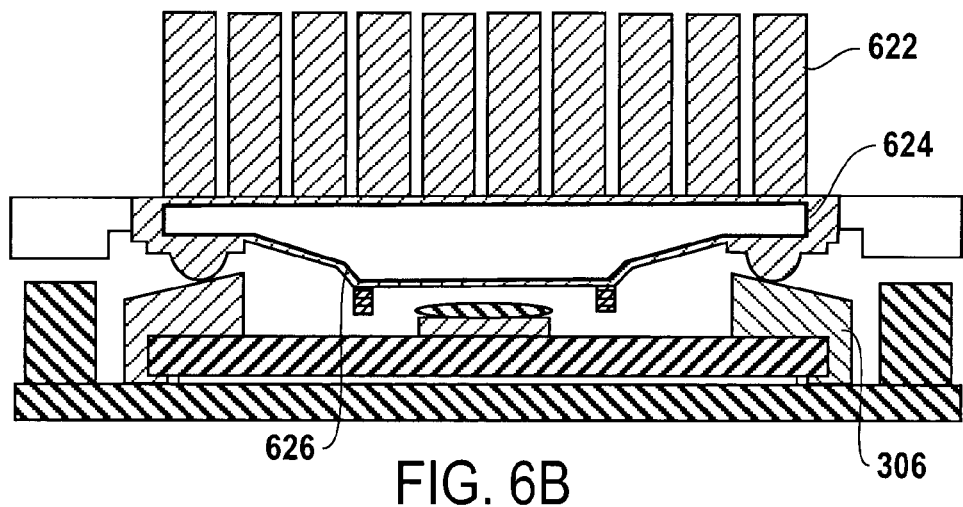
FIG. 6B is a side view of an alternative heatsink, in accordance with an embodiment of the present invention.

FIG. 6B is a side view of an alternative heatsink 622, in accordance with an embodiment of the present invention. The heatsink 622 includes a secondary material 626 in a contoured base 624. The secondary material 626 can be a different material than the remainder of the contoured base 624. The secondary material 626 can be a fluid or gas or a different solid material. By way of example, the secondary material 626 can be a copper or a copper alloy while the remainder of the contoured base 624 is made from aluminum or aluminum alloy. Similarly, the secondary material 626 can be aluminum or aluminum alloy while the remainder of the contoured base 624 is made from copper or copper alloy plating on the secondary material. It should be understood that these materials are merely exemplary materials and the invention should not be construed to be limited to the specifically named materials as any suitable material can be used.

Figure 6C:
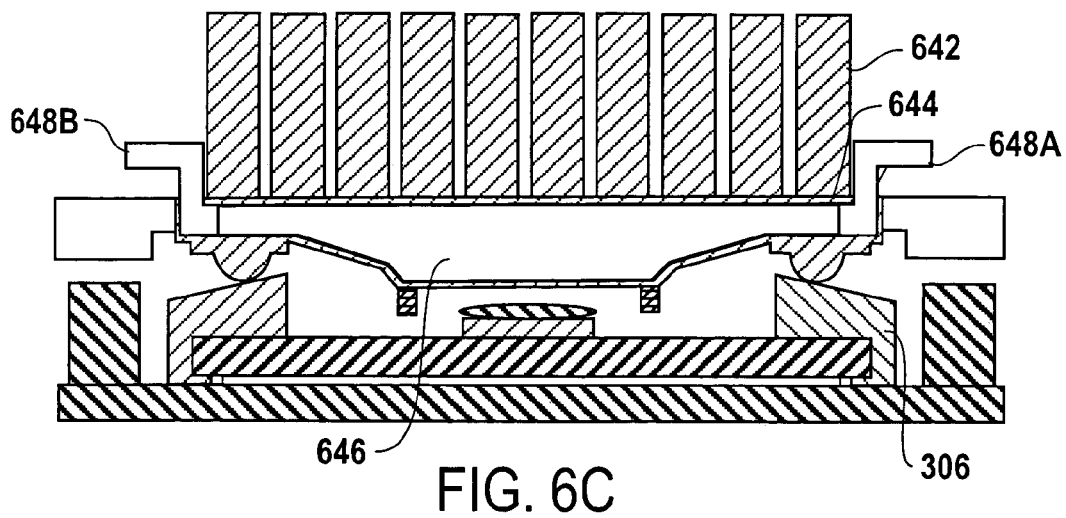
FIG. 6C is a side view of an alternative heatsink, in accordance with an embodiment of the present invention.

FIG. 6C is a side view of an alternative heatsink 642, in accordance with an embodiment of the present invention. The heatsink 642 includes a contoured base 644. The contoured base 644 includes an enclosed cavity 646. An inlet 648A and an outlet 648B are coupled to the cavity 646. The inlet 648A and the outlet 648B allow a fluid or gas to be flowed through the cavity 646 to transport heat away from the heatsink 642.

Figure 7A:
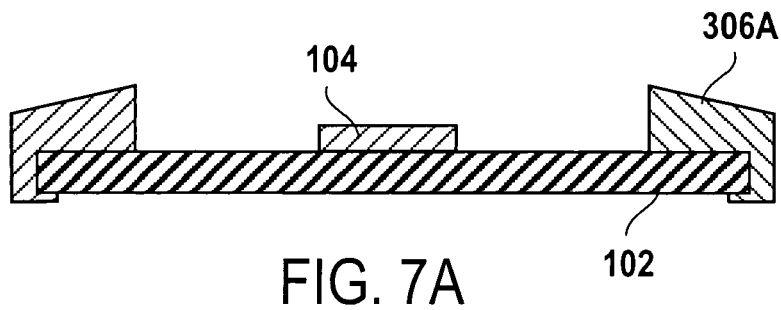
FIGS. 7A-D are cross-sectional views of an elastomeric support ring, in accordance with multiple embodiments of the present invention.
Figure 7B:
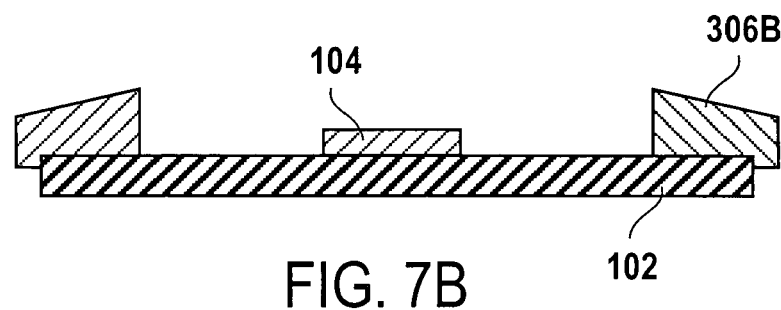
Figure 7C:
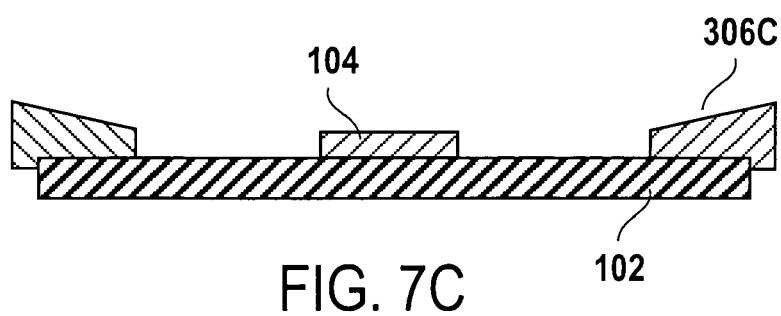
Figure 7D:
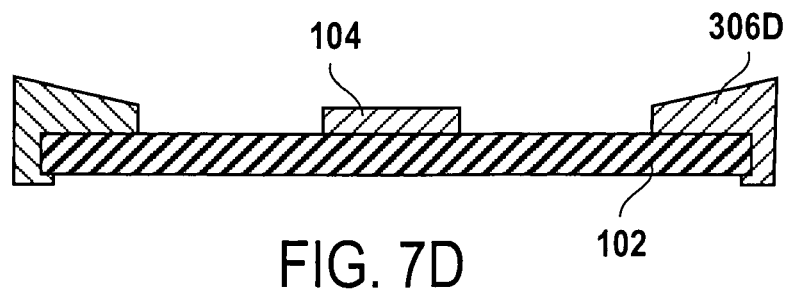

FIGS. 7A-D are cross-sectional views of an elastomeric support ring 306A-D, in accordance with multiple embodiments of the present invention. The cross-sectional shape of the elastomeric support ring 306A-D can be fine-tuned based on space available, desired geometry and loading considerations. The package design may allow the elastomeric support ring 306A and D to "wrap around" the edge of the substrate 102, as shown in FIGS. 7A and 7D. Alternatively, if the package design does not allow the elastomeric support ring 306B and C to "wrap around" the edge of the substrate 102, as shown in FIGS. 7B and 7C, a "hat style" elastomeric support ring 306B and C can be used.

The cross-sectional shape of the elastomeric support ring 306C and D can be sloped away from the die 104. Similarly, the cross-sectional shape of the elastomeric support ring 306A and B can be sloped toward the die 104. The cross-sectional shape of the elastomeric support ring 306A-D can be constant or varying to provide the desired loading function.

While the elastomeric rings 306, 306A-D are described in some detail above, it should also be understood that the elastomeric rings 306, 306A-D may not completely encircle the substrate 102 or the die 104. By way of example, the elastomeric rings 306, 306A-D can be segments of rings or more simply elastomeric blocks placed in the desired locations to form the functions of the elastomeric support ring described above. It should also be understood that the elastomeric rings 306, 306A-D can be substantially circular or any other suitable shape capable of forming the functions of the elastomeric support ring described above.

The package stacks 300, 500 described above simplify test, burn-in and assembly issues by effectively decoupling the package from the semiconductor die 104 and substrate 102. The semiconductor die 104 and substrate 102 assemblies can be assembled, tested and burnt-in independently, and then be combined with the package stacks 300, 500.

The package stacks 300, 500 described above effectively decouple the materials with different CTEs in the package stack that would otherwise create assembly and test or qualification issues. As such, the package stacks 300, 500 can be used with materials of any CTE combination.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive such as maybe desired for a control system for performing the desired functions.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A decoupling package stack comprising:
a circuit board;
a substrate mounted on and electrically coupled to the circuit board;
a semiconductor die mounted on and electrically coupled to the substrate;
a deformable elastomeric support mounted on the substrate;
one or more mounts coupled to the circuit board; and
a heatsink including:
a contoured heatsink base having a spacer attached thereto, the spacer operable to determine and maintain a desired bondline of a first thermal interface material (TIM) between the semiconductor die and the contoured heatsink base;
one or more contact portions for contacting the deformable elastomeric support; and
one or more compressing surfaces coupled to the one or more mounts.

2. The decoupling package stack of claim 1, wherein the contoured heatsink base provides for load staging.

3. The decoupling package stack of claim 1, wherein the deformable elastomeric support shares a thermal load with the first TIM between the package and the contoured heatsink base.

4. The decoupling package stack of claim 1, wherein the deformable elastomeric support shares a physical load with the semiconductor die.

5. The decoupling package stack of claim 1, wherein a first portion of a physical load from the contoured heatsink base is applied to the deformable elastomeric support before a second portion of the physical load is applied to the semiconductor die.

6. The decoupling package stack of claim 5, wherein the deformable elastomeric support is at least partially deformed before the second portion of the physical load is applied to the semiconductor die.

7. The decoupling package stack of claim 1, further comprising a lid interposed between the semiconductor die and the contoured heatsink base.

8. The decoupling package stack of claim 7, wherein the lid is thermally coupled by a second TIM interposed between the lid and the semiconductor die.

9. The decoupling package stack of claim 8, wherein the lid distributes heat radiating from the semiconductor die to the contoured heatsink base.

10. The decoupling package stack of claim 1, wherein the contoured heatsink base includes a secondary material.

11. The decoupling package stack of claim 1, wherein the contoured heatsink base includes:
an enclosed cavity capable of containing a cooling media;
an inlet coupled to the cavity and capable of flowing the cooling media into the enclosed cavity; and
an outlet coupled to the cavity and capable of flowing the cooling media out of the enclosed cavity.

12. The decoupling package stack of claim 1, wherein the elastomeric support wraps around an edge of the substrate.

13. A decoupling package stack comprising:
a circuit board;
a substrate mounted on and electrically coupled to the circuit board;
a semiconductor die mounted on and electrically coupled to the substrate;
a deformable elastomeric support mounted on the substrate;
one or more mounts coupled to the circuit board; and
a heatsink including:
a contoured heatsink base having a spacer attached thereto, the spacer operable to determine and maintain an desired bondline of a first thermal interface material (TIM) between the semiconductor die and the contoured heatsink base;
one or more contact portions for contacting the deformable elastomeric support; and
one or more compressing surfaces coupled to the one or more mounts;
wherein a first portion of a physical load from the contoured heatsink base is applied to the deformable elastomeric support before a second portion of the physical load is applied to the semiconductor die and wherein the deformable elastomeric support is at least partially deformed before the second portion of the physical load is applied to the semiconductor die and wherein the deformable elastomeric support shares a thermal load with the first TIM between the package and the contoured heatsink base.

* * * * *